United States Patent
Lu

(10) Patent No.: US 11,271,547 B2
(45) Date of Patent: Mar. 8, 2022

(54) GATE DRIVE CIRCUIT, DRIVE DEVICE, SEMICONDUCTOR DEVICE, AND GATE DRIVE METHOD

(71) Applicant: FUJI ELECTRIC CO., LTD., Kanagawa (JP)

(72) Inventor: Hong-Fei Lu, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/914,858

(22) Filed: Jun. 29, 2020

(65) Prior Publication Data

US 2021/0058071 A1    Feb. 25, 2021

(30) Foreign Application Priority Data

Aug. 22, 2019  (JP) .............................. JP2019-152222

(51) Int. Cl.
*H03K 3/012*  (2006.01)
*H03K 17/687*  (2006.01)

(52) U.S. Cl.
CPC ........... *H03K 3/012* (2013.01); *H03K 17/687* (2013.01)

(58) Field of Classification Search
CPC .. H03K 17/687; H03K 17/6871; H03K 3/012; H03K 17/04206; H03K 17/6872–693
See application file for complete search history.

(56) References Cited

U.S. PATENT DOCUMENTS

| | | | |
|---|---|---|---|
| 10,469,067 B2 | 11/2019 | Kaneda | |
| 2019/0019771 A1* | 1/2019 | Otsuka | ................ H01L 29/7813 |
| 2020/0021282 A1* | 1/2020 | Yamamoto | ........... H03K 17/168 |

FOREIGN PATENT DOCUMENTS

| | | |
|---|---|---|
| JP | H11-234104 | 8/1999 |
| JP | 2018-078721 | 5/2018 |

* cited by examiner

*Primary Examiner* — Patrick C Chen
(74) *Attorney, Agent, or Firm* — IPUSA, PLLC

(57) ABSTRACT

A gate drive circuit includes: a drive unit configured to drive a gate of a main circuit element including a majority carrier device; and a drive capability change unit configured to cause the drive unit to increase a drive capability of turning on the main circuit element as a main circuit current that flows through the main circuit element decreases.

10 Claims, 7 Drawing Sheets

GATE DRIVE CIRCUIT, DRIVE DEVICE, SEMICONDUCTOR DEVICE, AND GATE DRIVE METHOD

CROSS-REFERENCE TO RELATED APPLICATION

This application is based upon and claims priority to Japanese Patent Application No. 2019-152222, filed on Aug. 22, 2019, the entire contents of which are incorporated herein by reference.

BACKGROUND OF THE INVENTION

1. Field of the Invention

The present invention relates to a gate drive circuit, a drive device, a semiconductor device, and a gate drive method.

2. Description of the Related Art

FIG. 1 is a circuit diagram illustrating a switching power supply device 100 including a gate drive circuit 10. The gate drive circuit 10 illustrated in FIG. 1 includes gate resistors connected to a main switching element 20, and the gate resistors include voltage controlled resistors 11-1 and 11-2 of which the resistance value can be continuously changed. Further, the gate drive circuit 10 includes switching elements 14-1 and 14-2 and a signal source 15. Further, a freewheeling diode 30 is connected to the main switching element 20 in antiparallel. The main switching element is turned on by a current that flows through the voltage controlled resistor 11-1 by turning on the switching element 14-1. The main switching element 20 is turned off by a current that flows through the voltage controlled resistor 11-2 by turning on the switching element 14-2.

In the example illustrated in FIG. 1, the gate drive circuit 10 includes a control circuit 12 and input units 13-1 and 13-2. An output current of the main switching element 20 detected by a current sensor 40 is input to the control circuit 12. The control circuit 12 converts the output current of the main switching element 20 into voltages for controlling the voltage controlled resistors 11-1 and 11-2. The voltage for controlling the voltage controlled resistor 11-1 is input from the control circuit 12 to the voltage controlled resistor 11-1 via the input unit 13-1. The voltage for controlling the voltage controlled resistor 11-2 is input from the control circuit 12 to the voltage controlled resistor 11-2 via the input unit 13-2.

In the gate drive circuit 10, the surge voltage is suppressed by changing the resistance value of the voltage controlled resistor 11-1 to increase as the output current value of the main switching element 20 decreases (see Patent Document 1).

RELATED-ART DOCUMENTS

Patent Document

[Patent Document 1] Japanese Laid-open Patent Publication No. 2018-78721
[Patent Document 2] Japanese Laid-open Patent Publication No. H11-234104

However, in a case of driving a gate of a main circuit element including a majority carrier device in which majority carriers contribute to electrical conduction, in a conventional manner, losses may be increased.

Hence, the present disclosure provides a gate drive circuit, a drive device, a semiconductor device, and a gate drive method capable of suppressing losses that occur in a main circuit element including a majority carrier device.

SUMMARY OF THE INVENTION

The present disclosure provides a gate drive circuit including: a drive unit configured to drive a gate of a main circuit element including a majority carrier device; and a drive capability change unit configured to cause the drive unit to increase a drive capability of turning on the main circuit element as a main circuit current that flows through the main circuit element decreases.

Also, the present disclosure provides a drive device including: a main circuit element including a majority carrier device; a drive unit configured to drive a gate of the main circuit element; and a drive capability change unit configured to cause the drive unit to increase a drive capability of turning on the main circuit element as a main circuit current that flows through the main circuit element decreases.

Also, the present disclosure provides a gate semiconductor device including: a main circuit element including a majority carrier device; a gate drive circuit configured to drive a gate of the main circuit element; and a control circuit configured to control the gate drive circuit to increase a drive capability of turning on the main circuit element as a main circuit current that flows through the main circuit element decreases.

Also, the present disclosure provides a gate drive method for driving a gate of a main circuit element including a majority carrier device by a drive unit, the gate drive method including: causing the drive unit to increase a drive capability of turning on the main circuit element as a main circuit current that flows through the main circuit element decreases.

According to the present disclosure, it is possible to provide a gate drive circuit, a drive device, a semiconductor device, and a gate drive method capable of suppressing losses that occur in a main circuit element including a majority carrier device.

DETAILED DESCRIPTION OF THE EMBODIMENTS

In the following, an embodiment according to the present disclosure will be described with reference to the drawings.

Figure 1:
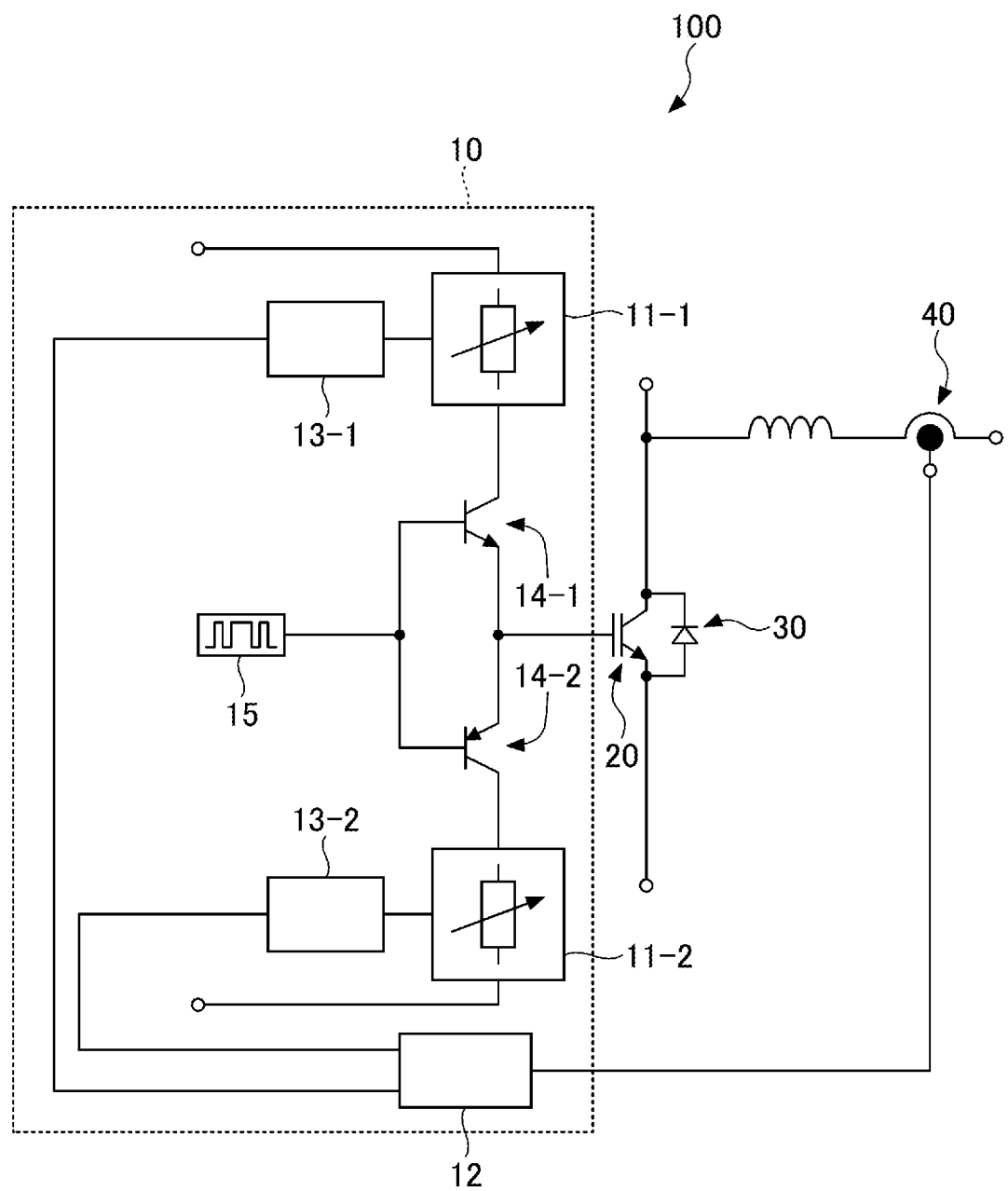
FIG. 1 is a diagram illustrating a configuration example of a conventional switching power supply device including a gate drive circuit.
Figure 2:
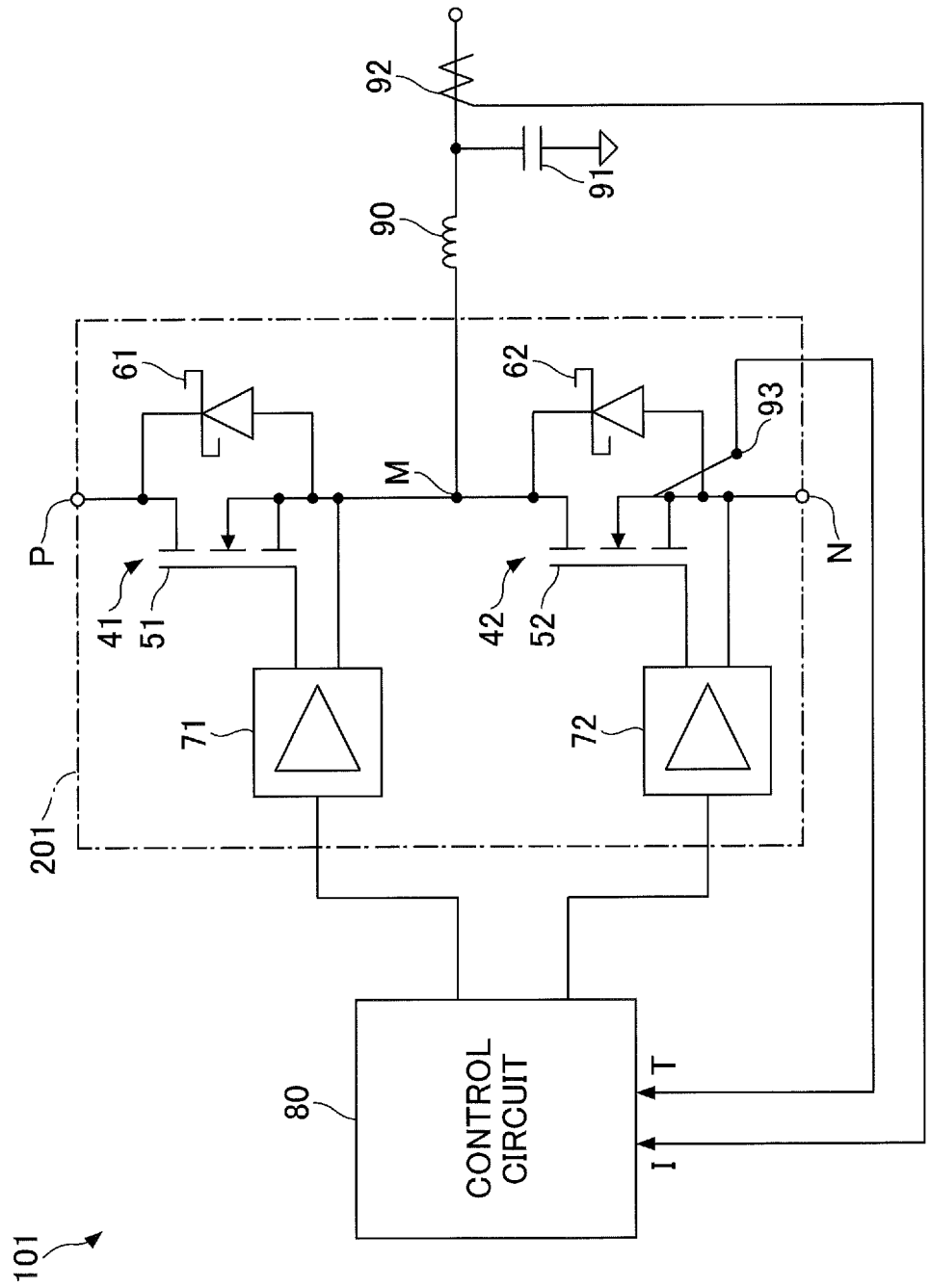
FIG. 2 is a diagram illustrating a configuration example of a semiconductor device including a gate drive circuit.

FIG. 2 is a diagram illustrating a configuration example of a semiconductor device 101 including a gate drive circuit according to an embodiment. The semiconductor device 101 illustrated in FIG. 2 is a power converter that uses a high-side switching element 51 and a low-side switching element 52 to convert DC input power to desired DC or AC output power. A load (not illustrated) is connected to a connection point M between the switching element 51 and the switching element 52 and, in the case of FIG. 2, the load (not illustrated) is connected via a coil 90. One end of the coil 90 is connected to the connection point M, and one end of a capacitor 91 is connected to the other end of the coil 90. The other end of the capacitor 91 is electrically connectable to a low power supply potential portion N.

The semiconductor device 101 includes a drive device 201, the coil 90, the capacitor 91, a current sensor 92, and a control circuit 80. The drive device 201 includes a high power supply potential portion P, the low power supply potential portion N, main circuit elements 41 and 42, and gate drive circuits 71 and 72. The main circuit element 41 includes the switching element 51 and a diode 61 that is connected in antiparallel to the switching element 51. The main circuit element 42 includes the switching element 52 and a diode 62 that is connected in antiparallel to the switching element 52.

The high power supply potential portion P and the low power supply potential portion N are a pair of conductive portions (e.g., a pair of power supply terminals) connected to a DC power supply (not illustrated) and to which DC power is supplied from the DC power supply. Examples of a DC power source include batteries, converters, regulators, rectifier circuits, capacitors, and the like. The low power supply potential portion N is a portion where the potential is lower than at the high power supply potential portion P. A DC power supply voltage Ed is applied between the high power supply potential portion P and the low power supply potential portion N.

The respective switching elements 51 and 52 are voltage driven semiconductor elements and are majority carrier devices each of which includes a control electrode (gate), a first main electrode (drain), and a second main electrode (source). The majority carriers refer to carriers of which the number is higher among electrons and holes that are co-existing in a semiconductor. The majority carriers are electrons in a case of n-type semiconductors and are holes in a case of p-type semiconductors. A majority carrier device is a unipolar device in which majority carriers contribute to electrical conduction. In contrast, a carrier device in which both electrons and holes contribute to electrical conduction is referred to as a minority carrier device or a bipolar device.

Specific examples of the switching elements 51 and 52, which are majority carrier devices, include a MOSFET (Metal Oxide Semiconductor Field Effect Transistor). FIG. 2 illustrates a case where the switching elements 51 and 52 are each an N channel type MOSFET including a gate G, a drain D and a source S. The switching elements 51 and 52, which are majority carrier devices, may be JFETs (junction FETs), SITs (Static Induction Transistors), HFETs (Heterojunction FETs (High Electron Mobility Transistors)), or other MOS-gated vertical devices. Examples of structures of vertical devices include planar structures and trench structures.

The switching elements 51 and 52 are connected in series with each other. The switching element 51 is connected between the high power supply potential portion P and the low power supply potential portion N, and is connected to the low power supply potential portion N through the switching element 52. The switching element 52 is connected between the high power supply potential portion P and the low power supply potential portion N, and is connected to the high power supply potential portion P through the switching element 51. The switching element 51 includes the gate G connected to the gate drive circuit 71, the drain D connected to the high power supply potential portion P, and the source S connected to the drain D of the switching element 52. The switching element 52 includes the gate G connected to the gate drive circuit 72, the source S connected to the low power supply potential portion N, and the drain D connected to the source S of the switching element 51.

For the switching element 51, the diode 61 is connected in antiparallel between the drain D and the source S. For the switching element 52, the diode 62 is connected in antiparallel between the drain D and the source S. The switching elements 51 and 52 and the diodes 61 and 62 may be one-packaged as a half bridge module.

The diodes 61 and 62 are majority carrier devices in which the majority carriers dominantly flow, for example, are majority carrier devices having a Schottky barrier junction. It should be noted that the diodes 61 and 62 may be PN junction diodes.

It is preferable that at least one of the switching elements 51 and 52 and the diodes 61 and 62 are elements including wide band gap semiconductors such as SiC (silicon carbide), GaN (gallium nitride), $Ga_2O_3$ (gallium oxide), or diamond. By applying wide band gap semiconductors to the switching elements 51 and 52, the effects of loss reduction of the switching elements 51 and 52 are increased. It should be noted that the switching elements 51 and 52 may be switching elements including semiconductors such as Si (silicon). Similarly, by applying elements including wide band gap semiconductors to the diodes 61 and 62, the effects of loss reduction of the diodes 61 and 62 are increased. It should be noted that the diodes 61 and 62 may be elements including semiconductors such as Si (silicon).

The gate drive circuit 71 is a first gate drive circuit that supplies a positive or negative voltage to the gate of the switching element 51 and turns on or off the gate of the switching element 51. The gate drive circuit 72 is a second gate drive circuit that supplies a positive or negative voltage to the gate of the switching element 52 and turns on or off the gate of the switching element 52. The gate drive circuit 71 of high side drives the gate of the switching element 51 with variable drive capability. The gate drive circuit 72 of low side drives the gate of the switching element with variable drive capability. The gate drive circuits 71 and 72 have configurations that are the same with each other.

The control circuit 80 outputs a first control command to turn on or off the switching element 51 and a second control command to turn on or off the switching element 52 so that the switching element 51 and the switching element 52 switch on or off in opposite phases. The control circuit 80 may output the first control command and the second control command so that the switching element 51 is on when the switching element 52 is off and the switching element 52 is on when the switching element 51 is off.

The first control command is a signal to command switching (on or off) of the switching element 51 in the main circuit element 41, and is, for example, a pulse width modulated signal (a PWM signal). The second control command is a signal to command switching (on or off) of the switching element 52 in the main circuit element 42, and is, for example, a pulse width modulated signal (a PWM signal). In a case in which the first control command and the second control command are PWM signals, when its signal level is at an active level (which is a high level, for example), it represents an on command of the switching element in the main circuit element. On the other hand, when its signal level is at an inactive level (which is a low level, for example), it represents an off command of the switching element in the main circuit element.

The gate drive circuit 71 turns on or off the switching element 51 in the main circuit element 41 in accordance with the first control command from the control circuit 80. The gate drive circuit 72 turns on or off the switching element 52 in the main circuit element 42 in accordance with the second control command from the control circuit 80.

Next, the variable drive capability of the gate drive circuits 71 and 72 will be described.

Figure 8:
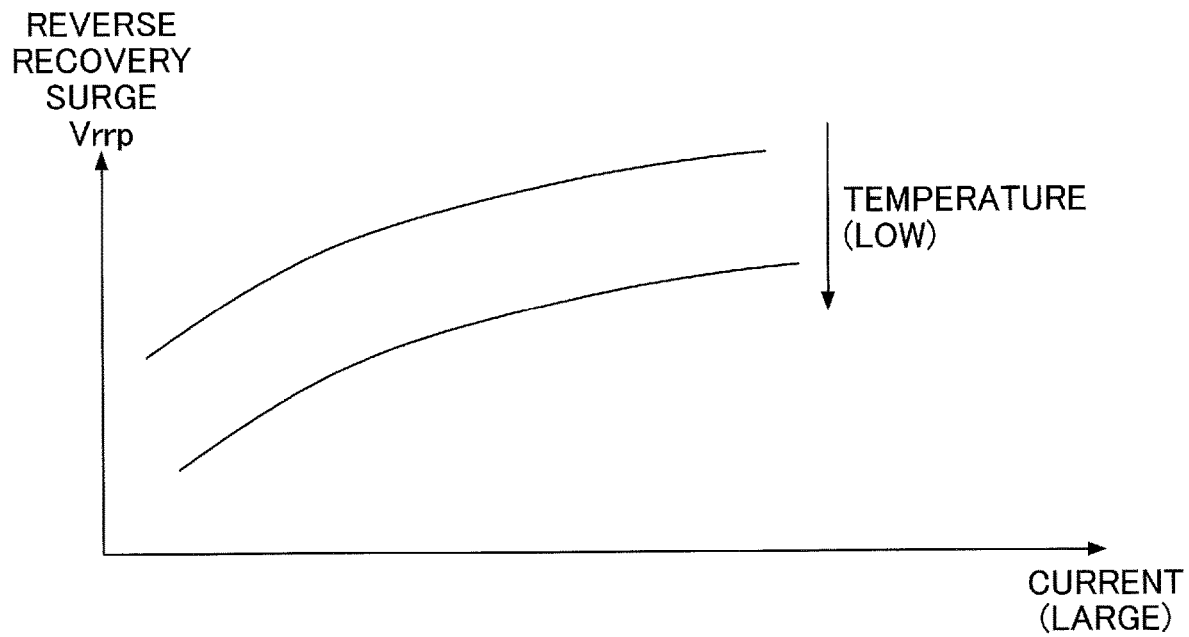
FIG. 8 is a diode property diagram illustrating a relationship between a forward current that flows through a diode and a reverse recovery surge voltage that occurs at both ends of the diode.

FIG. 8 is a diode property diagram illustrating a relationship between a forward current that flows through a diode and a reverse recovery surge voltage that occurs at both ends of the diode. When a switching element is turned on, and when a forward current is flowing through a diode connected in antiparallel to a switching element facing the switching element that is turned on, a reverse recovery surge voltage Vrrp occurs at both ends of the diode. A switching element facing a high side switching element represents a low side switching element and a switching element facing a low side switching element represents a high side switching element.

In a case in which the diode 62 is a majority carrier device, as the forward current flowing through the diode 62 decreases, the reverse recovery surge voltage Vrrp that occurs at both ends of the diode 62 due to turn-on of the switching element 51 decreases (see FIG. 8). Similarly, in a case in which the diode 61 is a majority carrier device, as the forward current flowing through the diode 61 decreases, the reverse recovery surge voltage Vrrp that occurs at both ends of the diode 61 due to turn-on of the switching element 52 decreases (see FIG. 8). The reason is that when a diode, which is a majority carrier device, is reverse recovered, only the majority carriers charged with the internal capacitance are discharged, and no voltage surges are generated by internal elements due to discharging of the minority carriers, differing from bipolar devices. Thus, because the reverse recovery surge voltage Vrrp generated by turning on the switching element when a relatively small forward current is flowing through the diode is relatively low, speedup of turn-on of the switching element is allowed in a safe operation area. That is, in an area where the forward current is relatively small, by increasing the drive capability of turning on the switching element to speed up turn-on of the switching element, an increase in the turn-on loss can be suppressed by shortening the switching time at the time of turn-on.

Also, in a case in which the switching elements 51 and 52 are majority carrier device, differing from a bipolar device, forward recovery losses due to insufficient conductivity modulation at high-speed switching do not occur. Therefore, by speeding up the turn-on of the switching elements 51 and 52, an increase in the turn-on loss can be suppressed.

A main circuit current that flows through the main circuit element 41 or the main circuit element 42 corresponds to a forward current that flows through the diode 61 or the diode 62 or to a main current that flows through the switching element 51 or the switching element 52. A main current that flows through a switching element represents a current that flows between the drain D and the source S of the switching element. Accordingly, the control circuit 80 controls the gate drive circuits 71 and 72 to increase the drive capability of turning on the switching elements 51 and of the main circuit elements 41 and 42, as the main circuit current that flows through the main circuit element 41 or the main circuit element 42 decreases. Thereby, as in "PRESENT DISCLOSURE" in FIG. 10, the reverse recovery loss Err of the diodes 61 and 62 and the turn-on loss Eon occurring at the turn-on time at the switching elements 51 and 52 are reduced.

Figure 10:
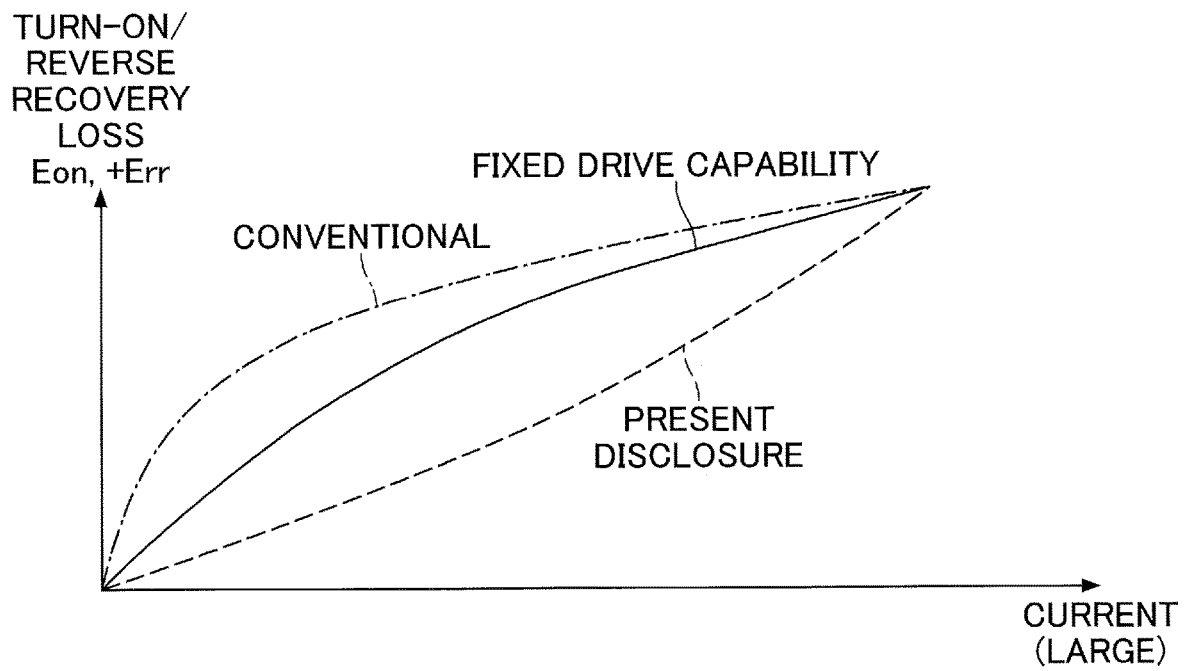
FIG. 10 is a diagram illustrating a turn-on loss and a reverse recovery occurring with respect to a main circuit current that flows through a main circuit element.

FIG. 10 is a diagram illustrating a turn-on loss and a reverse recovery loss that occur with respect to a main circuit current that flows through a main circuit element. In FIG. 10, "CONVENTIONAL" indicates a case in which, as the main circuit current that flows through the main circuit element decreases, the drive capability of turning on the switching element of the main circuit element is decreased. In FIG. 10, "FIXED DRIVE CAPABILITY" indicates a case in which, regardless of the magnitude of the main circuit current that flows through the main circuit element, the drive capability of turning on the switching element of the main circuit element is fixed. Also, "PRESENT DISCLOSURE" indicates a case in which, as the main circuit current that flows through the main circuit element decreases, the drive capability of turning on the switching element of the main circuit element is increased. As illustrated by FIG. 10, the turn-on loss Eon and the reverse recovery loss Err are reduced by "PRESENT DISCLOSURE" in comparison to "CONVENTIONAL" and "FIXED DRIVE CAPABILITY".

In the example illustrated in FIG. 2, the current value Is of the main circuit current that flows through the main circuit element 41 or the main circuit element 42 is approximately equal to the current value I of the current (coil current) that flows through the coil 90 and can be detected by the current sensor 92.

Figure 3:
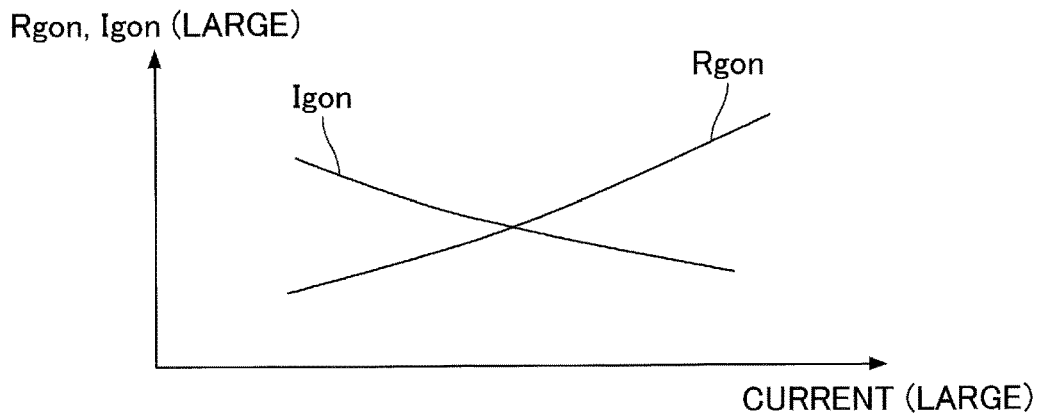
FIG. 3 is a diagram illustrating a drive property in which, as the main circuit current that flows through the main circuit element decreases, the drive capability of turning on the main circuit element increases.

For example, in accordance with the drive property of FIG. 3, as the current value I detected by the current sensor 92 decreases, the control circuit 80 commands the gate drive circuits 71 and 72 to reduce the resistance values Rgon of the drive resistors that are connected to the respective gates of the switching elements 51 and 52. Thereby, as the current value Is of the main circuit current decreases, the drive capability of the gate drive circuits 71 and 72 of turning on the switching elements 51 and 52 increases, and therefore, the turn-on loss of the switching elements 51 and 52 and the reverse recovery loss of the diodes 61 and 62 are reduced. For example, the drive resistor having the resistance value Rgon is inserted in series between the gate of the switching element and the high power supply voltage portion Vcc (or Vdd).

Alternatively, in accordance with the drive property of FIG. 3, as the current value I detected by the current sensor 92 decreases, the control circuit 80 commands the gate drive circuits 71 and 72 to increase the current values Igon of the drive currents that flow to the respective gates of the switching elements 51 and 5. Thereby, as the current value Is of the main circuit current decreases, the drive capability of the gate drive circuits 71 and 72 of turning on the switching elements 51 and 52 increases, and therefore, the turn-on loss of the switching elements 51 and 52 and the reverse recovery loss of the diodes 61 and 62 are reduced. For example, a current source for causing a drive current having the current value Igon to flow is inserted in series between the gate of the switching element and the high power supply voltage portion Vcc (or Vdd).

Also, in response to a decrease in the temperature, the internal capacitance of a main circuit element (an antiparallel connection pair of a switching element and a diode) having a majority carrier device decreases, and therefore the reverse recovery surge voltage Vrrp decreases (see FIG. 8). Therefore, in a relatively low temperature range, speedup of turn-on of the switching element is allowed in a safe operation range.

Thus, as the temperature of the main circuit element 41 or the main circuit element 42 increases, the control circuit 80 controls the gate drive circuits 71 and 72 to decrease the drive capability of turning on the switching elements 51 and 52. Thereby, as in "PRESENT DISCLOSURE" illustrated by FIG. 11, the reverse recovery loss Err of the diodes 61 and 62 and the turn-on loss Eon occurring at the turn-on time at the switching elements 51 and 52 are reduced.

Figure 11:
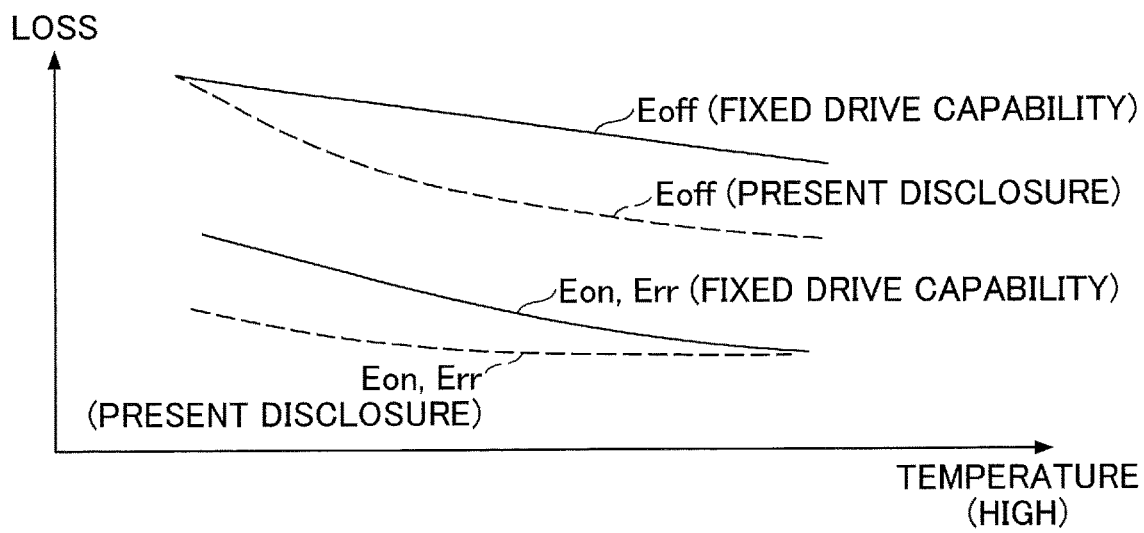
FIG. 11 is a diagram illustrating losses (turn-off loss, turn-on loss, and reverse recovery loss) that occur with respect to the temperature of a main circuit element.

FIG. 10 is a diagram illustrating losses (turn-off loss, turn-on loss, and reverse recovery loss) that occur with respect to the temperature of a main circuit element. In FIG. 11, "Eon, Err (FIXED DRIVE CAPABILITY)" indicates a case in which, regardless of the temperature of the main circuit element, the drive capability of turning on the switching element of the main circuit element is fixed. Also, "Eon, Err (PRESENT DISCLOSURE)" indicates a case in which, as the temperature of the main circuit element increases, the drive capability of turning on the switching element of the main circuit element is decreased. As illustrated by FIG. 11, the turn-on loss Eon and the reverse recovery loss Err are reduced by "PRESENT DISCLOSURE" in comparison to "FIXED DRIVE CAPABILITY".

The temperature T of the main circuit element 41 or the main circuit element 42 can be obtained by a temperature sensor 93, for example, as illustrated in FIG. 2. The temperature sensor 93 detects the temperature, for example, by a change of the resistance value of an on-chip resistor of the main circuit element.

Figure 4:
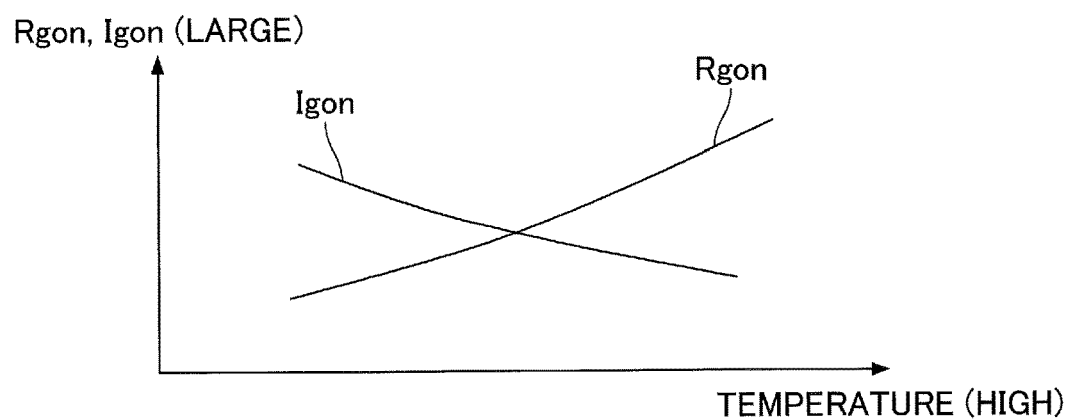
FIG. 4 is a diagram illustrating a drive property in which, as the temperature of the main circuit current increases, the drive capability of turning on the main circuit element decreases.

For example, in accordance with the drive property of FIG. 4, as the temperature T detected by the temperature sensor 93 increases, the control circuit 80 commands the gate drive circuits 71 and 72 to increase the resistance values Rgon of the drive resistors that are connected to the respective gates of the switching elements 51 and 52. Thereby, as the temperature T increases, the drive capability of the gate drive circuits 71 and 72 of turning on the switching elements 51 and 52 decreases, and therefore, the turn-on loss of the switching elements 51 and 52 and the reverse recovery loss of the diodes 61 and 62 are reduced.

Alternatively, in accordance with the drive property of FIG. 4, as the temperature T detected by the temperature sensor 93 increases, the control circuit 80 commands the gate drive circuits 71 and 72 to decrease the current values Igon of the drive currents that flow to the respective gates of the switching elements 51 and 5. Thereby, as the temperature T increases, the drive capability of the gate drive circuits 71 and 72 of turning on the switching elements 51 and 52 decreases, and therefore, the turn-on loss of the switching elements 51 and 52 and the reverse recovery loss of the diodes 61 and 62 are reduced.

Figure 9:
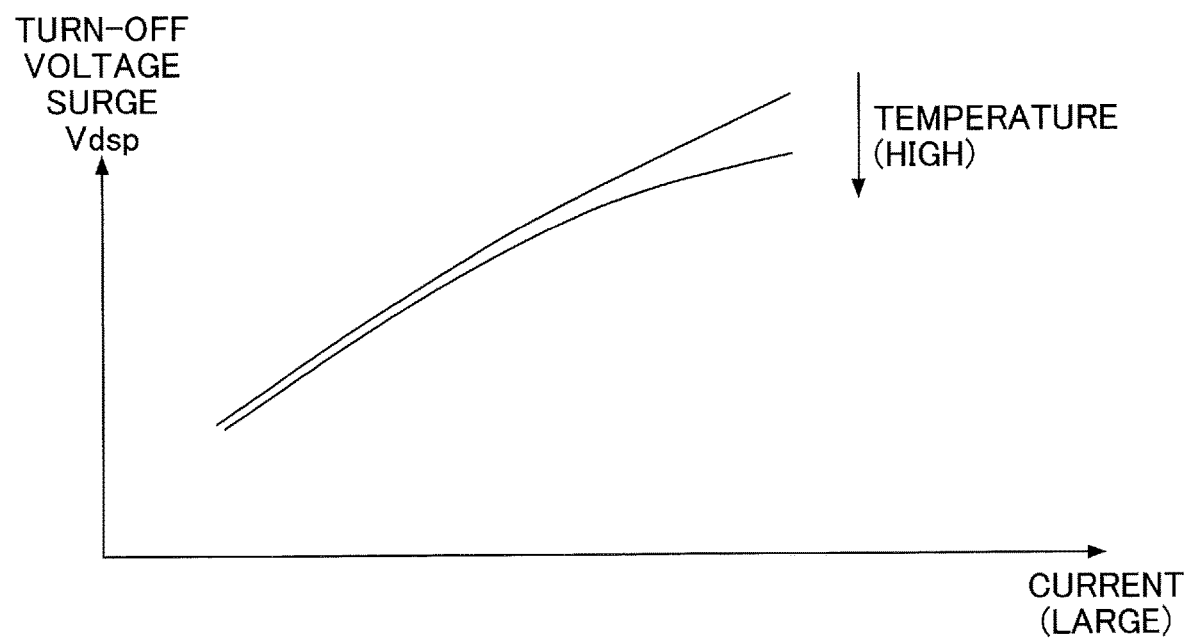
FIG. 9 is a transistor property diagram illustrating a relationship between a main current that flows through a switching element and a surge voltage at the time of turning-off the switching element.

Also, a main circuit element having a majority carrier device has a property that, as a main circuit current that flows through the main circuit element increases, the surge voltage at the time of turn-off increases, and as the temperature increases, the surge voltage at the time of turn-off decreases (see FIG. 9). The reason why, as the temperature increases, the off surge voltage Vdsp decreases is because due to a decrease in the carrier mobility at a higher temperature, the switching time increases, the rate of change over time di/dt of the main circuit current decreases, and the off surge voltage due to parasitic inductance decreases.

Thus, as the temperature of the main circuit element 41 or the main circuit element 42 increases, the control circuit 80 controls the gate drive circuits 71 and 72 to increase the drive capability of turning off the switching elements 51 and 52. Thereby, because the turn-off time is reduced, as in "PRESENT DISCLOSURE" illustrated by FIG. 11, the turn-off loss Eoff occurring at the turn-off time at the switching elements 51 and 52 is reduced.

In FIG. 11, "Eoff (FIXED DRIVE CAPABILITY)" indicates a case in which, regardless of the temperature of the main circuit element, the drive capability of turning off the switching element of the main circuit element is fixed. Also, "Eoff (PRESENT DISCLOSURE)" indicates a case in which, as the temperature of the main circuit element increases, the drive capability of turning off the switching element of the main circuit element is increased. As illustrated by FIG. 11, the turn-on loss Eoff is reduced by "PRESENT DISCLOSURE" in comparison to "FIXED DRIVE CAPABILITY".

Figure 5:
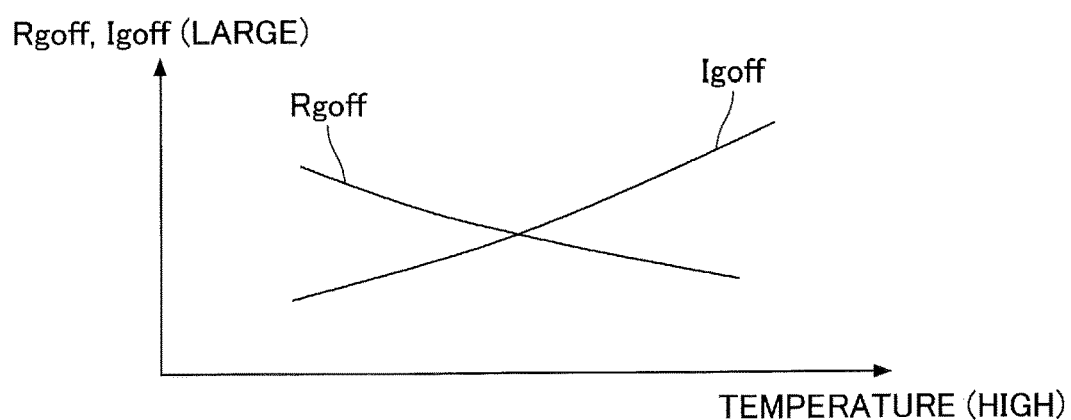
FIG. 5 is a diagram illustrating a drive property in which, as the temperature of the main circuit current increases, the drive capability of turning off the main circuit element increases.

For example, in accordance with the drive property of FIG. 5, as the temperature T detected by the temperature sensor 93 increases, the control circuit 80 causes the gate drive circuits 71 and 72 to decrease the resistance values Rgoff of the drive resistors that are connected to the respective gates of the switching elements 51 and 52. Thereby, as the temperature T increases, the drive capability of the gate drive circuits 71 and 72 of turning off the switching elements 51 and 52 increases, and therefore, the turn-off loss of the switching elements 51 and 52 is reduced. For example, a drive resistor having the resistance value Rgoff is inserted in series between the gate of the switching element and the low power supply voltage portion −Vcc (or −Vdd).

Alternatively, in accordance with the drive property of FIG. 5, as the temperature T detected by the temperature sensor 93 increases, the control circuit 80 commands the gate drive circuits 71 and 72 to increase the current values Igoff of the drive currents that flow to the respective gates of the switching elements 51 and 5. Thereby, as the temperature T increases, the drive capability of the gate drive circuits 71 and 72 of turning off the switching elements 51 and 52 increases, and therefore, the turn-off loss of the switching elements 51 and 52 is reduced. For example, a current source for causing a drive current having the current value Igoff to flow is inserted in series between the gate of the switching element and the low power supply voltage portion −Vcc (or −Vdd).

Next, respective configuration examples of the gate drive circuits 71 and 72 will be described. The gate drive circuits 71 and 72 have configurations that are the same with each other.

Figure 6:
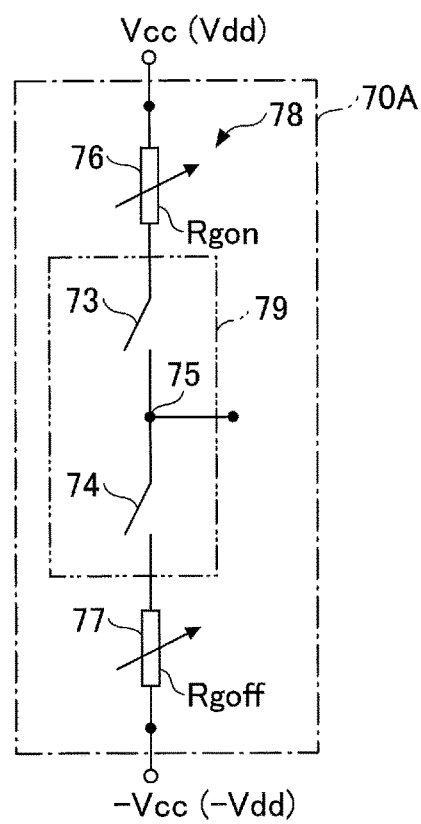
FIG. 6 is a diagram illustrating a first configuration example of a gate drive circuit.

FIG. 6 is a diagram illustrating a first configuration example of a gate drive circuit 70A having a variable drive capability, and illustrates a circuit example of a voltage driven type. The gate drive circuit 70A of FIG. 6 includes a drive unit 79 that drives a gate of a main circuit element including a majority carrier device; and a drive capability change unit 78 that causes the drive unit 79 to change the drive capability of turning on or turning off the main circuit element in response to the current value I of the main circuit current that flows through the main circuit element.

The drive unit 79 includes a high side switch 73 and a low side switch 74, and the drive capability change unit 78 includes variable drive resistors 76 and 77. The gate of the switching element of the main circuit element is connected to a middle point 75. The variable drive resistor 76 whose resistance value Rgon varies and the high side switch 73 are inserted in series between the middle point 75 and a high power supply voltage portion Vcc (or Vdd). The variable drive resistor 77 whose resistance value Rgoff varies and the low side switch 74 are inserted in series between the middle point 75 and a low power supply voltage portion −Vcc (or −Vdd).

The high side switch 73 and the low side switch 74 are turned on or off in accordance with a control command (a control command that turns on or off the switching element in the main circuit element) from the control circuit 80 so as to be switched in opposite phases with each other.

Figure 12:
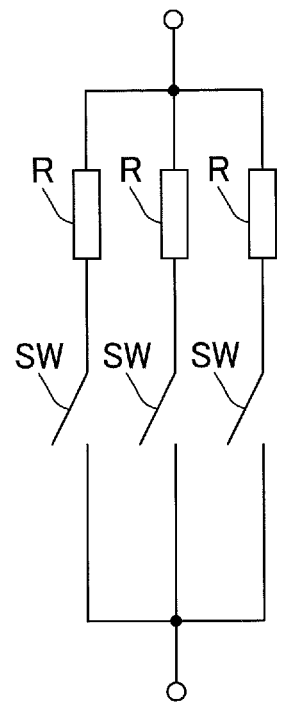
FIG. 12 is a diagram illustrating a configuration example of a variable drive resistor.

Each of the variable drive resistors 76 and 77 may have a known configuration, such as a digital variable resistor, or may have a configuration as illustrated in FIG. 12. FIG. 12 is a diagram illustrating a configuration example of a variable drive resistor. The variable drive resistance illustrated in FIG. 12 has a configuration in which a plurality of circuits, each of which includes a fixed resistor R and a power switch SW that are connected in series, are connected in parallel. The configuration illustrated in FIG. 12 can be applied to each of the high side drive stage and the low side drive stage with respect to the middle point 75 of FIG. 6. The power switch SW is commonly used for the high side switch 73 or the low side switch 74 of FIG. 6. According to the configuration of FIG. 12, in a case of driving a main circuit element having a relatively large capacity, because a current that flows through the gate of the main circuit element can be divided by a plurality of fixed resistors R, heat generation can be suppressed and the gate drive circuit can be reduced in size.

Figure 7:
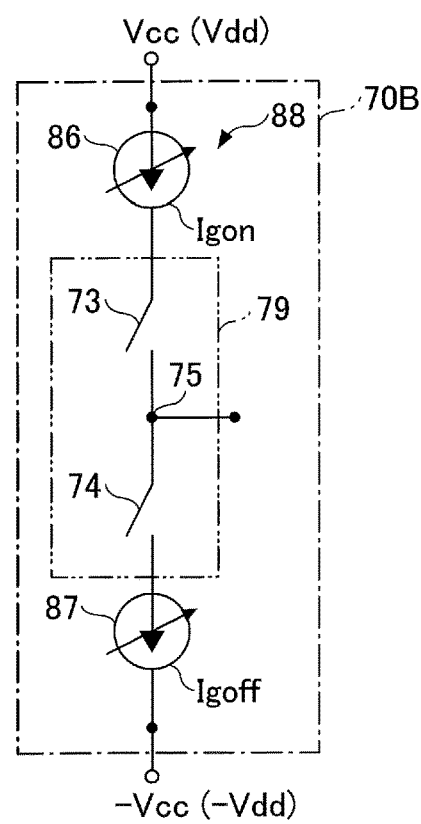
FIG. 7 is a diagram illustrating a second configuration example of a gate drive circuit.

FIG. 7 is a diagram illustrating a second configuration example of a gate drive circuit 70B having a variable drive capability, and illustrates a circuit example of a current driven type. The gate drive circuit 70B of FIG. 7 includes a drive unit 79 that drives a gate of a main circuit element including a majority carrier device; and a drive capability change unit 88 that causes the drive unit 79 to change the drive capability of turning on or turning off the main circuit element in response to the current value I of the main circuit current that flows through the main circuit element.

The drive unit 79 includes a high side switch and a low side switch 74, and the drive capability change unit 88 includes variable current sources 86 and 87. The variable current source 86 whose current value Igon varies and the high side switch 73 are inserted in series between a middle point 75 and a high power supply voltage portion Vcc (or Vdd). The variable current source 87 whose current value Igoff varies and the low side switch 74 are inserted in series between the middle point 75 and a low power supply voltage portion −Vcc (or −Vdd).

Figure 13:
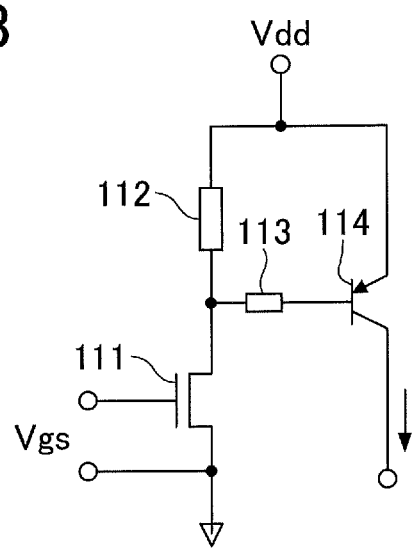
FIG. 13 is a diagram illustrating a configuration example of a variable current source.

Each of the variable current sources 86 and 87 may have a known configuration or a configuration as illustrated in FIG. 13. FIG. 13 is a diagram illustrating a configuration example of a variable current source. The variable current source illustrated in FIG. 13 includes transistors 111 and 114 and resistors 112 and 113. The configuration illustrated in FIG. 13 can be applied to the high side drive stage with respect to the middle point 75 of FIG. 7. In a case in which the configuration illustrated in FIG. 13 is applied to the low side drive stage, the configuration may be vertically inverted. The transistor 111 is commonly used for the high side switch 73 or the low side switch 74 of FIG. 7. The voltage Vgs between the gate and source of the transistor 111 is controlled in accordance with a control command (a control command to turn on or off the switching element in the main circuit element) from the control circuit 80. Because the base current of the transistor 114 can be adjusted by adjusting the voltage Vgs of the transistor 111, the current value Igon or the current value Igoff can be changed.

Although a gate drive circuit, a drive device, a semiconductor device, and a gate drive method have been described with reference to the embodiment, the present invention is not limited to the embodiment described above. Various modifications and enhancements, such as combinations and substitutions with some or all of the other embodiments, are possible within the scope of the present invention.

For example, a semiconductor device according to the present disclosure is not limited to a DC-DC converter that converts direct current to another direct current but can be applied to a semiconductor device in another embodiment by using one or more drive devices 201 (see FIG. 2). Specific examples of such a semiconductor device include an inverter for converting direct current to alternating current, a step-up converter for increasing an input voltage and outputting the increased voltage, a step-down converter for decreasing an input voltage and outputting the decreased voltage, and a buck-boost converter for increasing or decreasing an input voltage and outputting the increased or decreased voltage.

Further, for example, the main circuit element is not limited to a switching element with which a diode is connected in antiparallel, but may be in another embodiment, such as a thyristor.

For example, functional elements as described above may be realized by a memory that stores at least one program and by a processor coupled to the memory.

What is claimed is:

1. A gate drive circuit comprising:
   a drive unit configured to drive a gate of a main circuit element including a majority carrier device; and
   a drive capability change unit configured to cause the drive unit to increase a drive capability of turning on the main circuit element as a main circuit current that flows through the main circuit element decreases,
   wherein the drive capability change unit is configured to cause the drive unit to decrease the drive capability of turning on the main circuit element as a temperature of the main circuit element increases.

2. The gate drive circuit according to claim 1, wherein the drive capability change unit is configured to cause the drive unit to increase the drive capability of turning off the main circuit element as a temperature of the main circuit element increases.

3. The gate drive circuit according to claim 1,
wherein the drive capability change unit includes a drive resistor that is connected to the gate of the main circuit element or includes a current source for causing a drive current to flow to the gate of the main circuit element, and
wherein the drive capability change unit is configured to cause the drive unit to increase the drive capability of turning on or off the main circuit element, by reducing a resistance value of the drive resistor or increasing a current value of the drive current.

4. The gate drive circuit according to claim 1,
wherein the main circuit element includes a switching element and a diode that is connected in antiparallel to the switching element, and
wherein the switching element and the diode are majority carrier devices.

5. The gate drive circuit according to claim 1,
wherein the main circuit element includes a switching element that is a majority carrier device, and
wherein the switching element is a MOSFET, a JFET, a SIT, a HFET, or other MOS-gated vertical devices.

6. The gate drive circuit according to claim 1,
wherein the main circuit element includes a diode that is a majority carrier device, and
wherein the diode has a Schottky barrier junction.

7. The gate drive circuit according to claim 1, wherein the majority carrier device is an element including a wide band gap semiconductor.

8. A drive device comprising:
a main circuit element including a majority carrier device;
a gate drive unit configured to drive a gate of the main circuit element; and
a drive capability change unit configured to cause the gate drive unit to increase a drive capability of turning on the main circuit element as a main circuit current that flows through the main circuit element decreases,
wherein the drive capability change unit is configured to cause the drive unit to decrease the drive capability of turning on the main circuit element as a temperature of the main circuit element increases.

9. A semiconductor device comprising:
a main circuit element including a majority carrier device;
a gate drive circuit configured to drive a gate of the main circuit element; and
a control circuit configured to control the gate drive circuit to increase a drive capability of turning on the main circuit element as a main circuit current that flows through the main circuit element decreases,
wherein the control circuit is configured to cause the gate drive circuit to decrease the drive capability of turning on the main circuit element as a temperature of the main circuit element increases.

10. A gate drive method for driving a gate of a main circuit element including a majority carrier device by a drive unit, the gate drive method comprising:
causing the drive unit to increase a drive capability of turning on the main circuit element as a main circuit current that flows through the main circuit element decreases; and
causing the drive unit to decrease the drive capability of turning on the main circuit element as a temperature of the main circuit element increases.

* * * * *